(12) United States Patent
Lan

(10) Patent No.: US 7,524,711 B2
(45) Date of Patent: Apr. 28, 2009

(54) METHOD OF MANUFACTURING AN IMAGE TFT ARRAY FOR AN INDIRECT X-RAY SENSOR AND STRUCTURE THEREOF

(75) Inventor: Chih-Chieh Lan, Taipei (TW)

(73) Assignee: HannStar Display Corp., Tao-Yuan Hsien (TW)

( * ) Notice: Subject to any disclaimer, the term of this patent is extended or adjusted under 35 U.S.C. 154(b) by 463 days.

(21) Appl. No.: 11/163,476

(22) Filed: Oct. 20, 2005

(65) Prior Publication Data

US 2007/0090364 A1   Apr. 26, 2007

(51) Int. Cl.
  *H01L 21/00*   (2006.01)
  *H01L 21/84*   (2006.01)
(52) U.S. Cl. .................. 438/155; 438/159; 438/164
(58) Field of Classification Search .................. 438/151, 438/155, 159, 164, 149
  See application file for complete search history.

(56) References Cited

U.S. PATENT DOCUMENTS

| 5,895,936 | A | 4/1999 | Lee |
| 6,274,412 | B1 | 8/2001 | Kydd et al. |
| 6,362,484 | B1 | 3/2002 | Beyne et al. |
| 6,403,965 | B1 | 6/2002 | Ikeda et al. |
| 6,600,160 | B2 | 7/2003 | Kobayashi et al. |
| 6,806,472 | B2 | 10/2004 | Yoon et al. |
| 7,354,784 | B2 * | 4/2008 | Park et al. ...................... 438/30 |

\* cited by examiner

*Primary Examiner*—David S Blum
(74) *Attorney, Agent, or Firm*—Winston Hsu

(57) ABSTRACT

The present invention discloses a method of manufacturing an image TFT array and a structure thereof. A substrate is provided. At least one first line, a lower electrode, a pad electrode, a common electrode and a first electrode connected with the first line are defined simultaneously by etching a first conductive layer. At least one second line intersecting the first line, an upper electrode corresponding to the lower electrode, a second electrode connected with the second line and a third electrode connected with the upper electrode are defined simultaneously by etching a second conductive layer applied to cover the substrate and above the first conductive layer.

12 Claims, 17 Drawing Sheets

METHOD OF MANUFACTURING AN IMAGE TFT ARRAY FOR AN INDIRECT X-RAY SENSOR AND STRUCTURE THEREOF

BACKGROUND OF THE INVENTION

1. Field of the Invention

The present invention relates to a structure and a manufacturing method of an image TFT array, and more particular, to a structure and a manufacturing method of an image TFT array for an indirect X-ray sensor.

2. Description of the Prior Art

Recently, electronic matrix arrays find considerable application in X-ray image sensors. Such X-ray image sensors generally include scanning lines and data lines transversely and longitudinally spaced apart and across at an angle to one another, thereby forming a plurality of crossover points. Associated with each crossover point is an element or a pixel to be selectively addressed. These elements in many instances are memory cells or pixels of an electronically adjustable memory array or X-ray image TFT array.

A manufacturing method of an X-ray image TFT array according to the prior art includes seven photolithographic and etching processes. At first, the seven processes are concisely described as follows.

The first photolithographic and etching process includes forming a first metal layer and performing a photolithographic and etching process to form a lower electrode and a common electrode;

The second photolithographic and etching process includes forming a first insulation layer ($SiN_x$) and a second metal layer in sequence and performing a photolithographic and etching process to form a gate, a pad, and an upper electrode;

The third photolithographic and etching process includes forming a second insulation layer ($SiN_x$ or $SiN_x/SiO_x/SiN_x$), an amorphous-silicon layer, and a doping layer such as an $n^+$ amorphous-silicon layer in sequence, and performing a photolithographic and etching process to define a semiconductor island;

The fourth photolithographic and etching process includes performing a photolithographic and etching process, especially a photolithographic and wet etching process, to form through holes on a storage capacitor, common electrode, and pad;

The fifth photolithographic and etching process includes forming a third metal layer and performing a photolithographic, a third metal layer wet etching, and a channel etching process, especially a channel dry etching process, to define the third metal layer and the back channel regions of thin film transistors;

The sixth photolithographic and etching process includes forming a passivation layer and performing a photolithographic and etching process to form a through hole on the insulation layer for forming a storage capacitor; and The seventh photolithographic and etching process includes performing a photolithographic and etching process to form outer test patterns to complete the manufacturing method of an X-ray image TFT array according to the prior art.

Next, the above manufacturing method is interpreted with FIG. 1 to FIG. 6 as follows. FIG. 1 to FIG. 6 are schematic diagrams of a manufacturing method for a thin film transistor (TFT) array 10 for an X-ray image TFT array according to the prior art. As shown in FIG. 1, a substrate 12 is provided. The substrate 12 can be a transparent glass or quartz substrate. Then, a first metal layer (not shown in FIG. 1) is deposited on the substrate 12. A first photolithographic and etching process is performed to remove a portion of the first metal layer to form a lower electrode 16 and a common electrode 18.

As shown in FIG. 2, a first insulation layer 20 and a second metal layer (not shown in FIG. 2) are deposited on the substrate 12 in sequence. A second photolithographic and etching process is performed to remove a portion of the second metal layer to form a gate electrode 24, an upper electrode 26, and a pad 28 on the first insulation layer 20. It is noted that the lower electrode 16, the first insulation layer 20, and the upper electrode 26 constitute a storage capacitor.

Please refer to FIG. 3. A second insulation layer 30, an amorphous-silicon layer 32, and a doping layer 34 are deposited on the substrate 12. A third photolithographic and etching process is performed to remove a portion of the amorphous-silicon layer 32 and the doping layer 34 to define a semiconductor island 36.

As shown in FIG. 4, a fourth photolithographic and etching process, especially a photolithographic and wet etching process, is performed to remove a portion of the second insulation layer 30 and the first insulation layer 20 to form a first through hole 38 on the storage capacitor, a second through hole 40 on the pad 28, and a third through hole 42 on the common electrode 18.

As shown in FIG. 5, a third metal layer 44 is formed on the substrate 12. A fifth photolithographic and etching process, especially a photolithographic and wet etching process, is performed to remove a portion of the third metal layer 44 and an etching process, especially a dry etching process, is performed to form a channel 46 to define the third metal layer 44.

As shown in FIG. 6, a passivation layer 48 is deposited. A sixth photolithographic and etching process is performed to remove a portion of the passivation layer 48 to form a fourth through hole 50 on the storage capacitor. Finally, a seventh photolithographic and etching process is performed to form outer test patterns (not shown in FIG. 6) to complete the manufacturing method of the X-ray image TFT array 10 according to the prior art.

Conventionally, there are as many as seven photolithographic and etching processes. Due to the high number of photolithographic and etching processes, the particle issue produced in the transferring and etching process is more serious. Moreover, since the manufacturing process is complicated, the manufacturing time is longer and the quantity of output is influenced.

U.S. Pat. No. 6,403,965 discloses an X-ray image detector system as shown in FIGS. 7 and 8. FIG. 7 is a plan view of the X-ray image detector system, and FIG. 8 is a sectional view taken along line A-A' of FIG. 7. The X-ray image detector system comprises a plurality of signal lines 705, a plurality of scanning lines 706, a plurality of pixels 801, a bias line 806, an auxiliary capacity line 702, and an X-ray-to-charge converting part. Each of the pixels 801 comprises a switching element (TFT) 701, a protecting TFT 805, a pixel capacity 703, an auxiliary electrode 704 formed so as to face the pixel capacity 703, and a pixel electrode 707, the signal line 705, the scanning line 706, the bias line 806 and the X-ray-to-charge converting part. Each of the TFT 701, the protecting TFT 805 and the auxiliary electrode 704 is provided with a contact portion 709.

Referring to the sectional view of FIG. 8, the X-ray image detector system includes a glass substrate 201, gate electrodes 202 of the switching element 701 and the protecting TFT 805, the pixel capacity 703. Then, an insulator film 203, an amorphous silicon film 204 and a stopper 205 are deposited. Then, an $n^+$-type amorphous silicon film 206 is deposited. The pixel capacity 703 is connected to a pixel capacity bias 803. Then, a film 207a and a film 207b are deposited to form a protective film 207. After contact holes are formed in the TFT 701, the protecting TFT 805, and the auxiliary electrode 704, a pixel electrode 707 is formed by an ITO (Indium Tin Oxide). A p-type Se film 208 for contact is deposited on the pixel electrode 707, and an Se film 209 is deposited thereon. Then, an Se film 210 is deposited and an n-type Se film 211 is deposited. Thereafter, an Al film is formed as a common electrode 212. Finally, the common electrode 212 is connected to a drive circuit (not shown).

It is noticed that this X-ray image detector system must be protected by the protecting TFT 805 and the film 207b comprising benzocyclobutene (BCB), and the pixel electrode 707 is also a necessary element and must be an ITO layer. In a function as a direct X-ray sensor, the image erase must be performed by irradiation of visible light through the outside of the glass substrate, such that the pixel area must have a transparent section. In case that the pixel capacity 703 is made of a metal material, it takes only a small portion of the pixel area, and a large portion must be left for transparency. While, if an indirect X-ray image sensor only has a small area of storage capacitor, the quality for image acquired will be affected, in addition that an ITO manufacturing process is not required for an indirect X-ray image sensor.

SUMMARY OF THE INVENTION

It is therefore an object of the present invention to provide a structure and manufacturing method of an image TFT array of an indirect X-ray sensor to resolve the above problems.

The present invention discloses a method of manufacturing an image TFT array as follows. A substrate is provided. A first conductive layer is applied to cover the substrate. At least one first line, a lower electrode, a pad electrode, a common electrode and a first electrode connected with the first line are defined simultaneously by etching the first conductive layer. A second conductive layer is applied to cover the substrate and above the first conductive layer. At least one second line intersecting the first line, an upper electrode corresponding to the lower electrode, a second electrode connected with the second line and a third electrode connected with the upper electrode are defined simultaneously by etching the second conductive layer.

The present invention further discloses a structure of an image TFT array of an indirect X-ray sensor. The structure includes a substrate, at least one first line; a lower electrode, a pad electrode, a common electrode and a first electrode connected with the first line positioned on the surface of the substrate; an insulation layer positioned on the substrate and the at least one first line, the lower electrode, the pad electrode, the common electrode and the first electrode; an island positioned over the first electrode; at least one second line cross-intersecting the first line, an upper electrode positioned corresponding to the lower electrode, a second electrode connected with the second line and a third electrode connected with the upper electrode positioned on the insulation layer, wherein the lower electrode and the upper electrode have an approximately the same size of area; a passivation layer covering the substrate, the at least one second line, the upper electrode, the second electrode, and the third electrode; and a first through hole positioned on the common electrode, and a second through hole positioned on the pad electrode, and an aperture positioned to expose a portion of the upper electrode.

The present invention integrates the first two processes used in the prior art into one process. The present invention utilizes only one photolithographic and etching process to define a gate electrode, at least one gate line, a common electrode, a lower electrode, and a pad electrode metal simultaneously, compared to the prior art which uses two photolithographic and etching processes, such that a photolithographic and etching process is saved, and, in turn, the process to form through holes on a storage capacitor, common electrode, and pad using another photolithographic and etching process also can be saved. Therefore, the particle issue produced in the transferring and etching process because of high number photolithographic and etching process in the prior art will be improved. With the simplified manufacturing process and the shortened manufacturing time, the throughput and yield are improved.

These and other objectives of the present invention will no doubt become obvious to those of ordinary skill in the art after reading the following detailed description of the preferred embodiment that is illustrated in the various figures and drawings.

DETAILED DESCRIPTION

A manufacturing method of an image TFT array of an indirect X-ray sensor according to the present invention is described as follows.

The first photolithographic and etching process includes forming a first conductive layer and performing a photolithographic and etching process to form at least one first line which may function as a gate line, a lower electrode which may function as an electrode of a storage capacitor, a pad electrode which may be positioned at periphery of the display area, a common electrode, and a first electrode which may function as a gate electrode; and The second photolithographic and etching process includes forming a second conductive layer and performing a photolithographic and etching process to form at least one second line which may function as a data line, an upper electrode which may function as an electrode of a storage capacitor, a second electrode as an electrode connecting with the data line, and a third electrode which may function as an electrode connecting with the upper electrode.

A step may be further performed to interpose an insulation layer between the first conductive layer and the second conductive layer.

An island region may be further defined above the first electrode and between the insulation layer and the second conductive layer.

Furthermore, a passivation layer may be applied to cover the substrate and a portion of the second conductive layer.

A first through hole may be further defined on the common electrode, a second through hole may be defined on the pad electrode, and an aperture may be defined to expose a portion of the upper electrode simultaneously by etching the passivation layer and the insulation layer.

Figure 1:
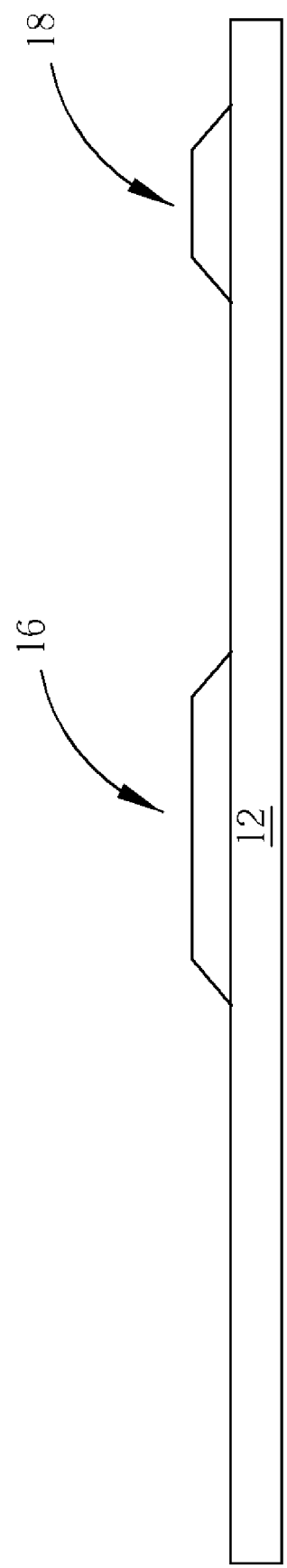
FIG. 1 to FIG. 6 are schematic diagrams of a manufacturing method for an X-ray image TFT array according to a prior art.
Figure 2:
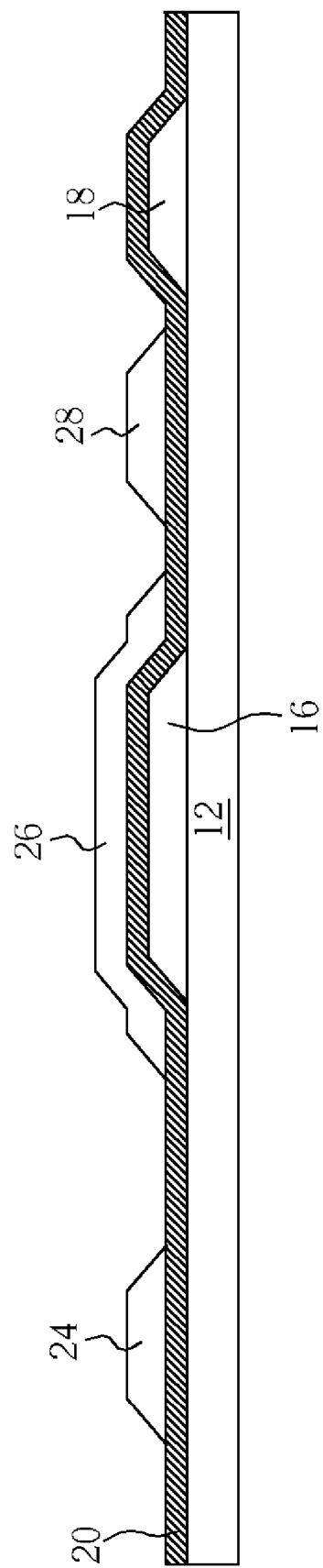
Figure 3:
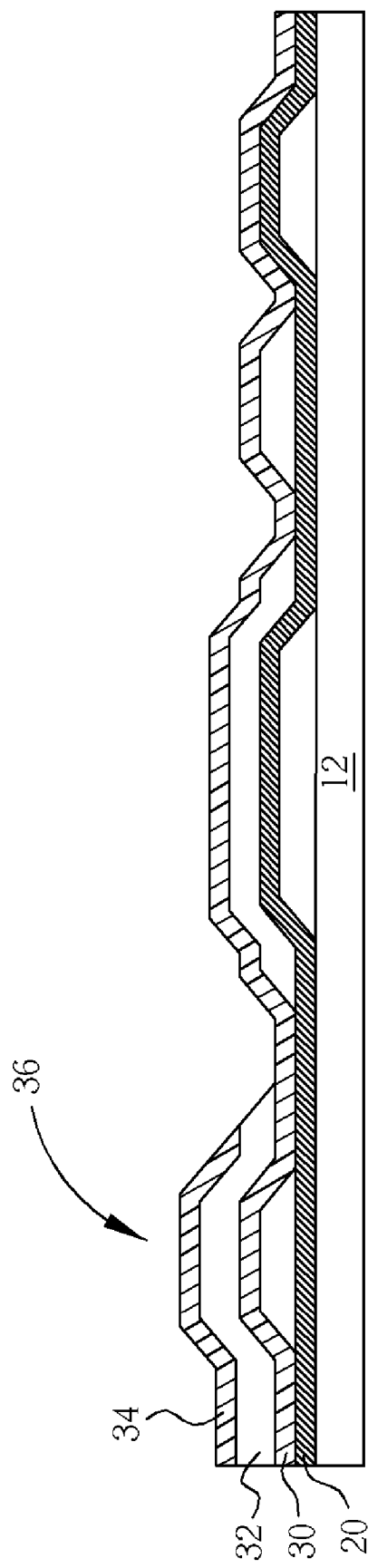
Figure 4:
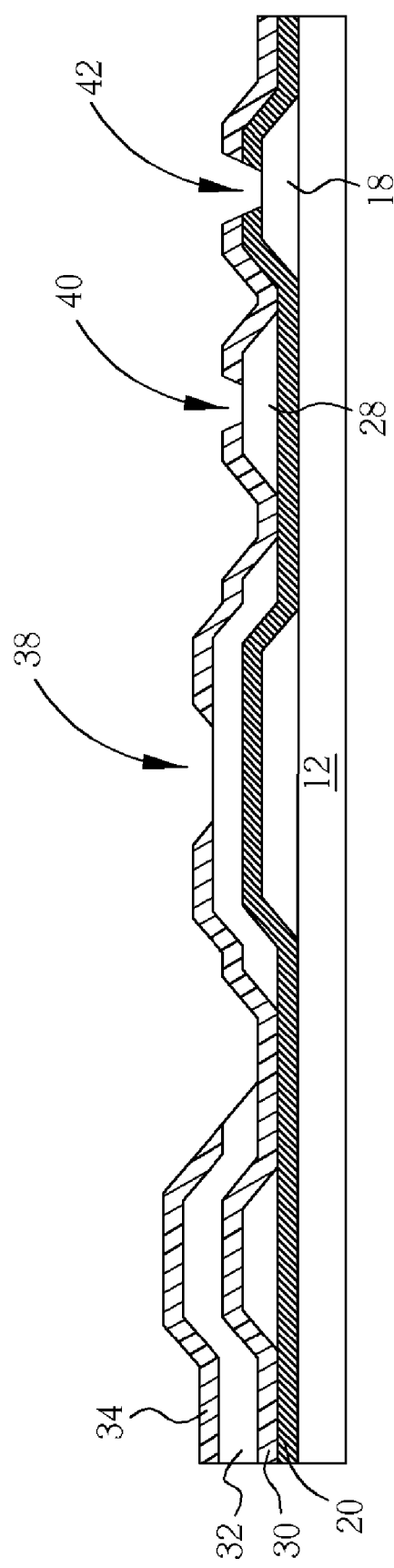
Figure 5:
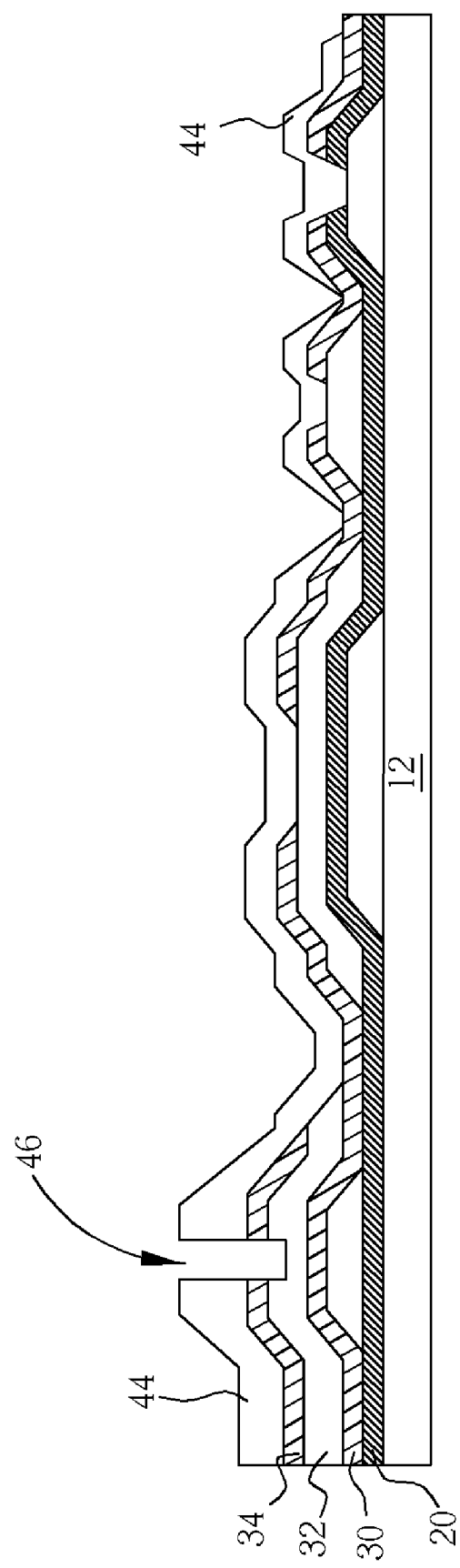
Figure 6:
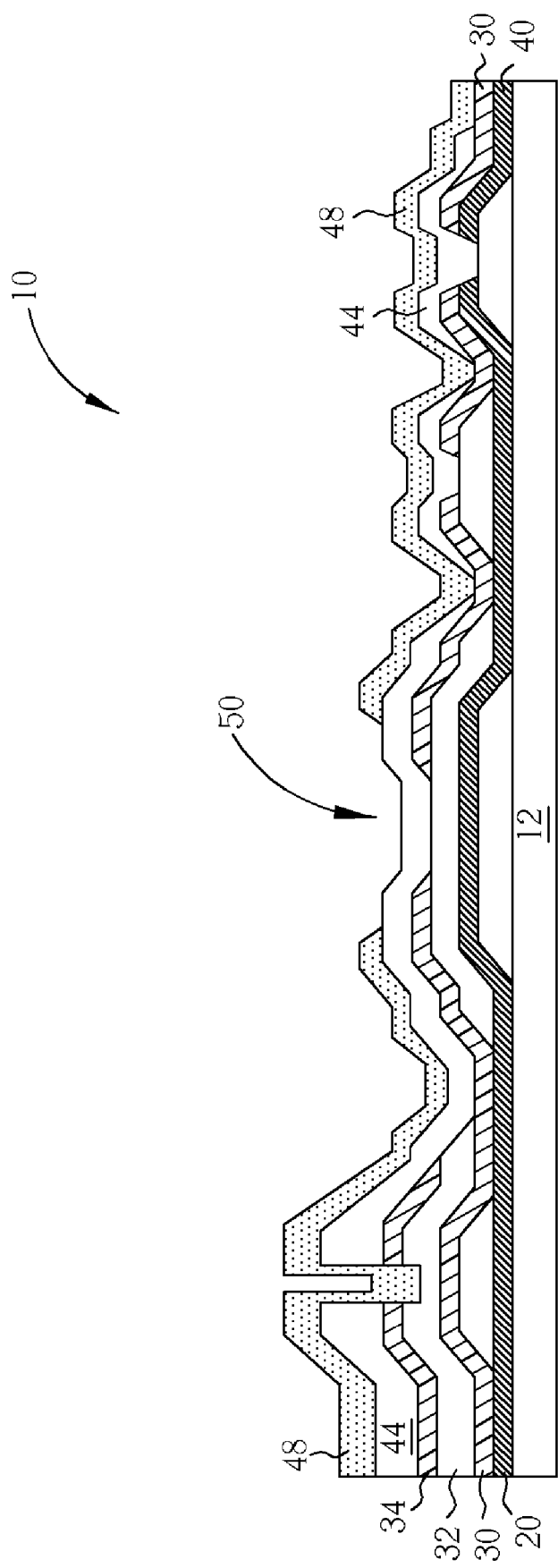
Figure 7:
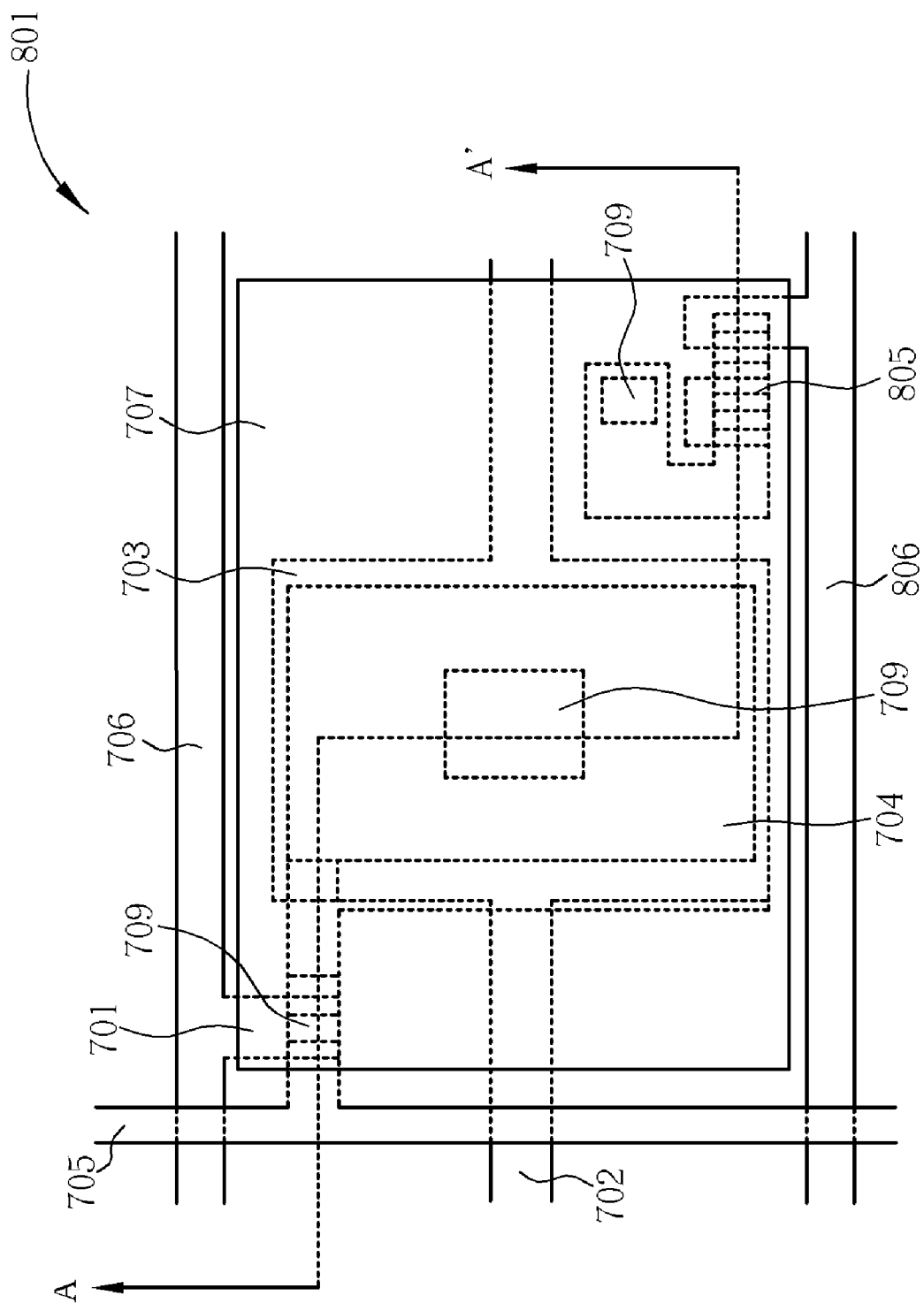
FIG. 7 and FIG. 8 are schematic diagrams of a manufacturing method for an image TFT array for a direct X-ray sensor according to a prior art.
Figure 8:
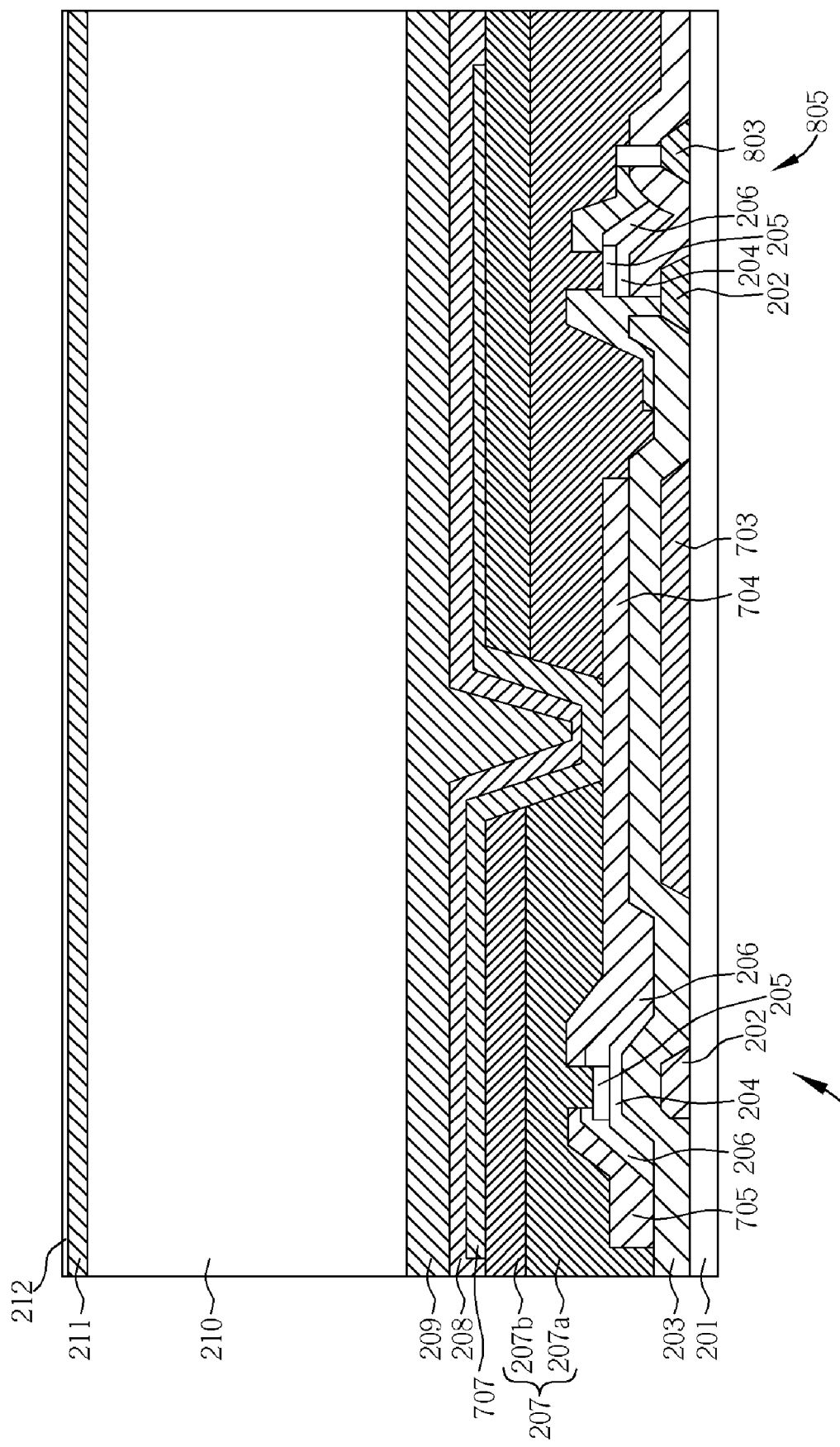
Figure 9:
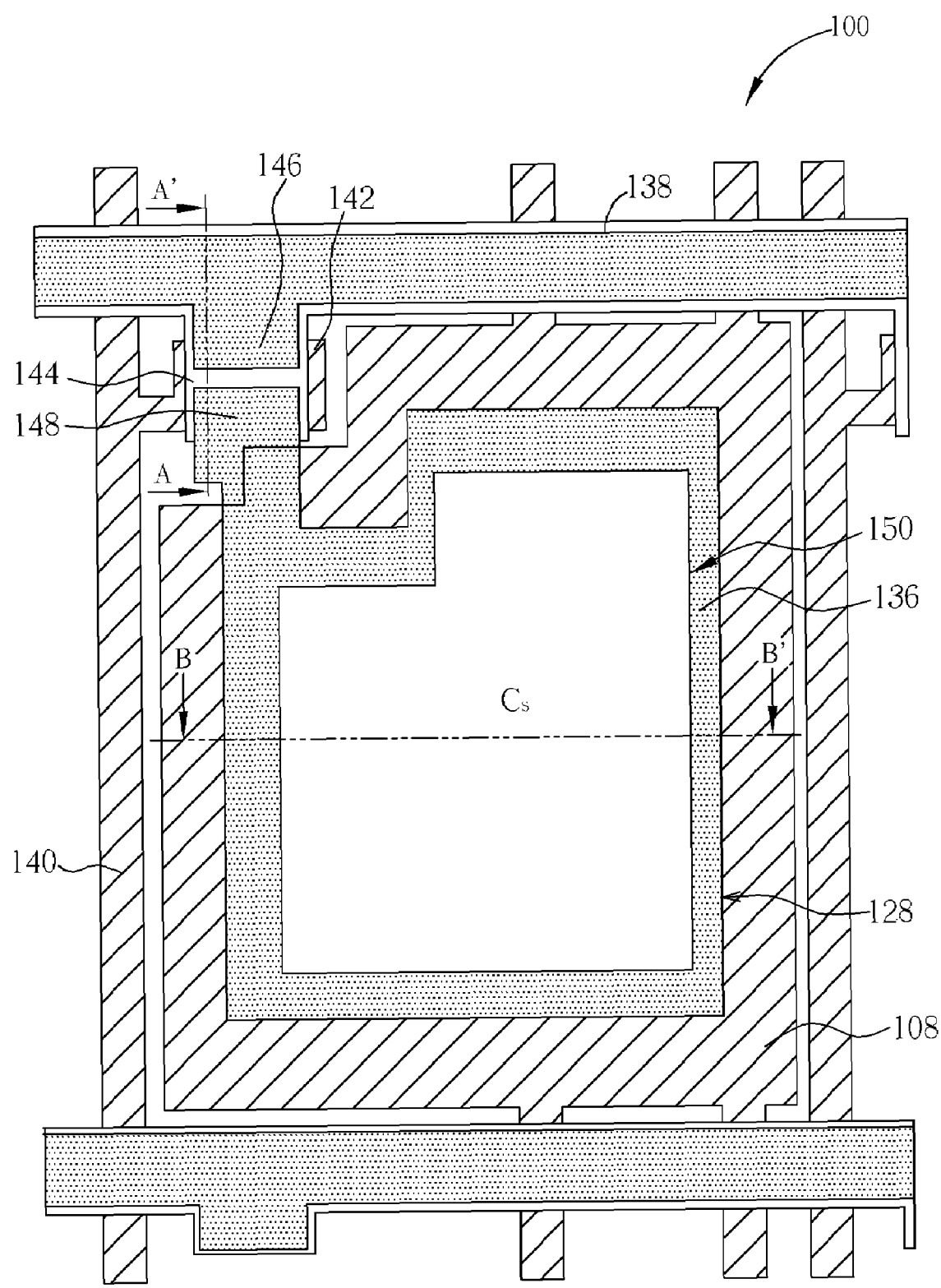
FIG. 9 shows a structure of an image TFT array for an indirect X-ray sensor according to the present invention.

Please refer to FIG. 9. FIG. 9 shows a structure of an image TFT array for an indirect X-ray sensor according to the present invention. The structure 100 comprises a substrate (not shown), a plurality of gate lines 140, a lower electrode 108, a pad electrode (not shown) which may be positioned at periphery of the display area, a common electrode (not shown), and a gate electrode 142 connected with the gate line 140. All of these elements are formed simultaneously from a conductive layer on the substrate, and, therefore, all of them are positioned on the surface of the substrate. An insulation layer covers the substrate and the gate lines 140, the lower electrode as a layer 108, the pad electrode, the common electrode and the gate electrode 142. An island 144 is positioned on the insulation layer above the gate electrode 142. A plurality of data lines 138 cross-intersect the gate lines 140. An upper electrode 128 is positioned on the insulation layer 120 (shown in FIG. 11) corresponding to the lower electrode. A second electrode 146 is connected with the data line 138. A third electrode 148 is connected with the upper electrode 128. The lower electrode and the upper electrode have approximately the same size of area, and the insulation layer 120 is disposed therebetween, forming a storage capacitor, Cs. A passivation layer 136 covers the substrate, the data lines 138, a peripheral portion of the upper electrode 128, the second electrode 146, and the third electrode 148. A first through hole (not shown) is positioned on the common electrode. A second through hole (not shown) is positioned on the pad electrode, and an aperture 150 is positioned to expose a portion of the upper electrode 128.

Figure 10:
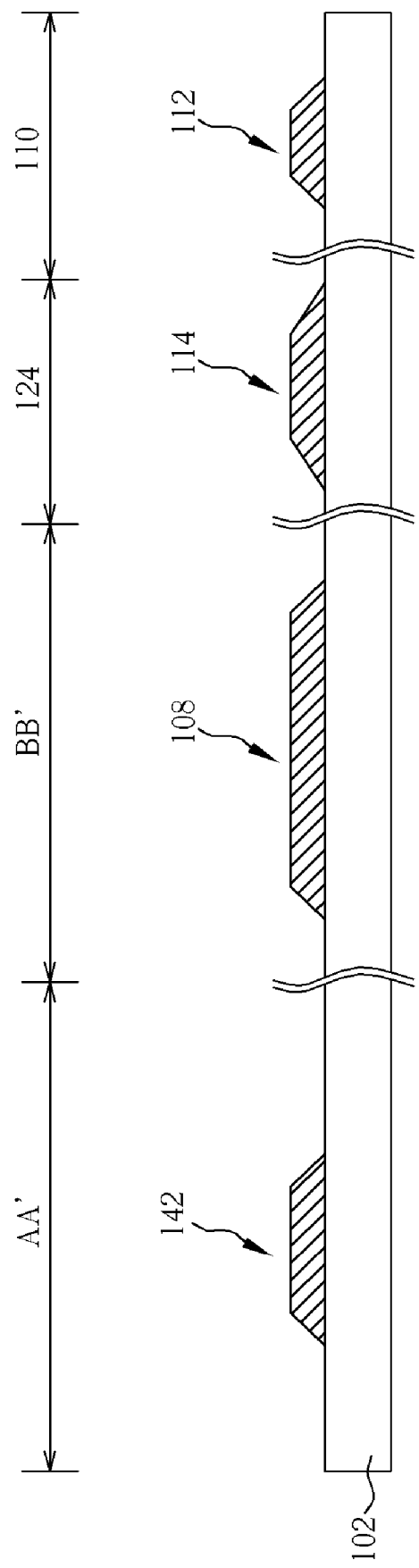
FIG. 10 to FIG. 13 are schematic diagrams of a manufacturing method of an image TFT array for an indirect X-ray sensor in an embodiment according to the present invention.

Please refer to FIGS. 10-13. FIGS. 10-13 are schematic diagrams of a manufacturing method of an image TFT array 100 in an embodiment according to the present invention, each showing cross sectional views taken along line A-A' for a thin film transition region, line B-B' for a storage capacitor region of FIG. 10, a pad region 124, and a common electrode region 110. As shown in FIG. 10, a substrate 102 is provided, and a conductive layer, such as metal or opaque conductive material, etc. is deposited on the substrate. The substrate 102 can be a transparent glass or quartz substrate. Next, a photolithographic and etching process is performed to pattern at least one gate line (not shown), a gate electrode 142, a lower electrode 108, a pad electrode 114 which is positioned at periphery of the display area, and a common electrode 112. It is noted that these elements are formed simultaneously from a conductive layer on the substrate 102.

Figure 11:
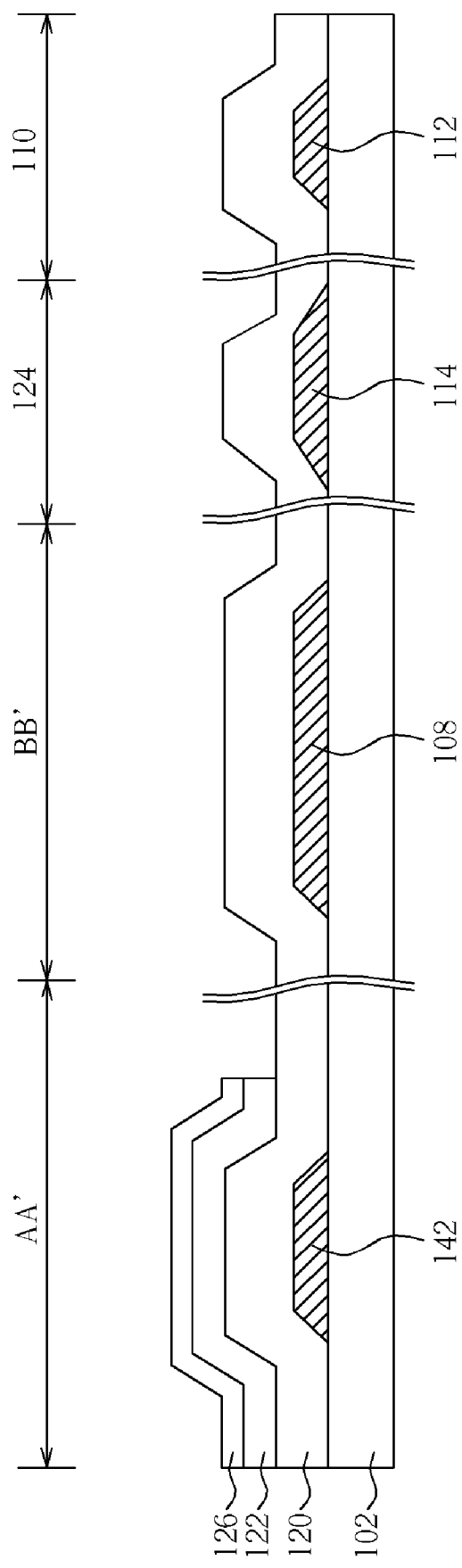

A shown in FIG. 11, an insulation layer 120 is deposited on the substrate 102, the gate line (not shown), the gate electrode 142, the lower electrode 108, and the pad electrode 114. The insulation layer 120 may comprise electric insulating material, such as, but not limited to, $SiO_2$, $SiN_x$, SiON, and the like. Then, an island region is defined above the gate electrode 142. A semiconductor layer 122 and a doped layer 126 are sequentially formed to cover the substrate 102 and to be on the insulation layer 120. Next, an etching process is performed to etch the semiconductor layer and the doped layer to define an island region above the gate electrode 142. The semiconductor layer 122 may comprise amorphous silicon. The doped layer 126 may comprise doped amorphous silicon layer (e.g. $n^+$ amorphous Si layer).

Figure 12:
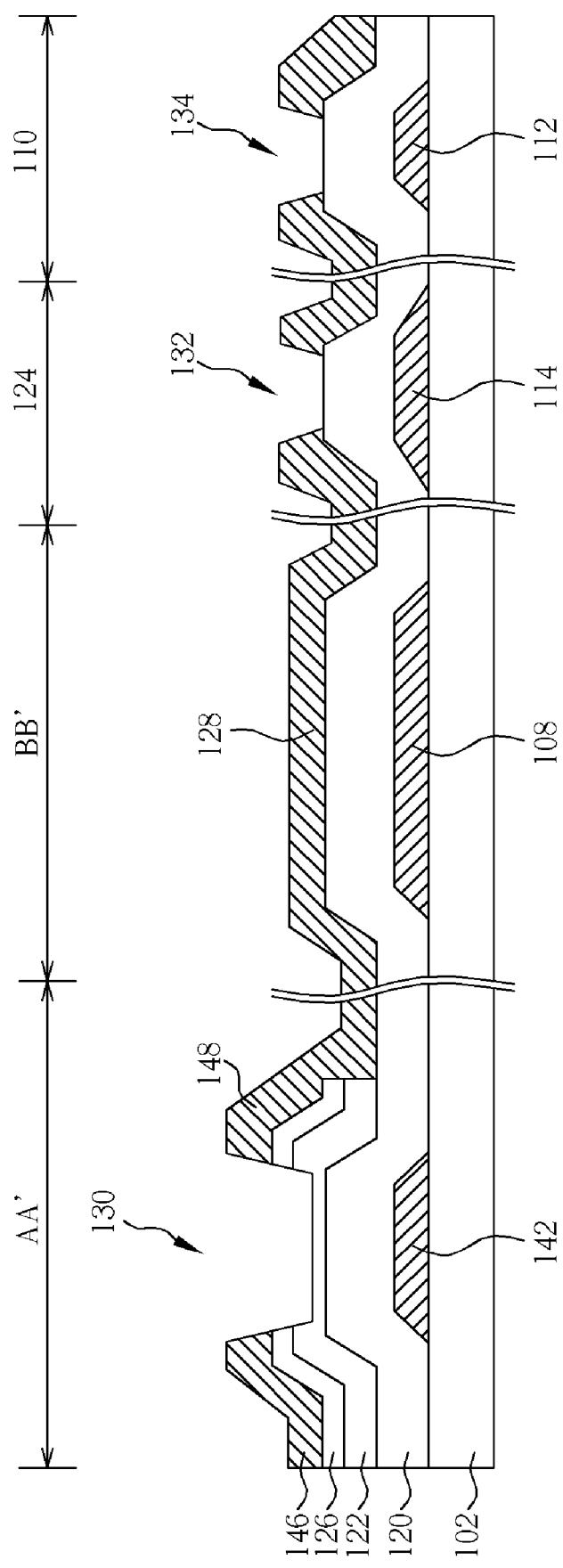

As shown in FIG. 12, a conductive layer is deposited to cover the substrate including the island region and the insulation layer 120. The conductive layer comprises for example a metal or an opaque conductive material, etc. Next, a photolithographic and etching process is performed to pattern at least one data line 138 (shown in FIG. 9) intersecting the gate line 140 (shown in FIG. 9), an upper electrode 128, an second electrode 146 connected with the data line 138, and an third electrode 148 connected with the upper electrode 128. It is noted that these elements are formed simultaneously from the second conductive layer. Accordingly, a gap 130 is formed through the conductive layer and part of the island region above the gate electrode. A second through hole 132 is formed through the conductive layer above the pad electrode 114. A first through hole 134 is formed through the conductive layer above the common electrode 112. The gate electrode 142, the second electrode 146, and the third electrode 148 constitute a switching element for energizing or otherwise addressing a corresponding memory cell or storage capacitor.

Figure 13:
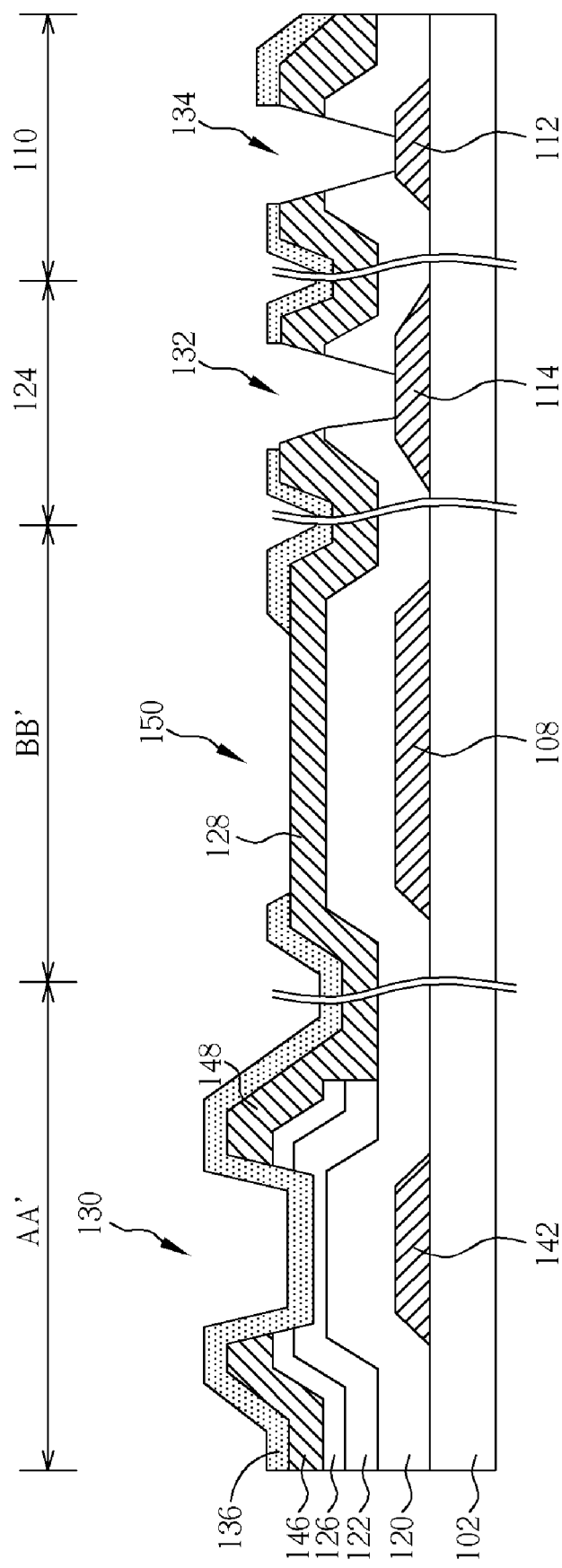

As shown in FIG. 13, a passivation layer 136 is deposited to cover the substrate including the conductive layer and the gap and openings. Next, a photolithographic and etching process is performed to pattern a first through hole 134 on the common electrode 112, a second through hole 132 on the pad electrode 114, and an aperture 150 exposing a portion of the upper electrode 128 by etching the passivation layer and the insulation layer. The aperture 150 is used for a connection of the storage capacitor with a photodiode.

Finally, a fourth photolithographic and etching process is performed to form outer test patterns (not shown in FIG. 13) to complete the manufacturing method of the image TFT array 100 according to the embodiment of the present invention. The image TFT array 100 of the present invention can be used in an indirect X-ray sensor.

Figure 16:
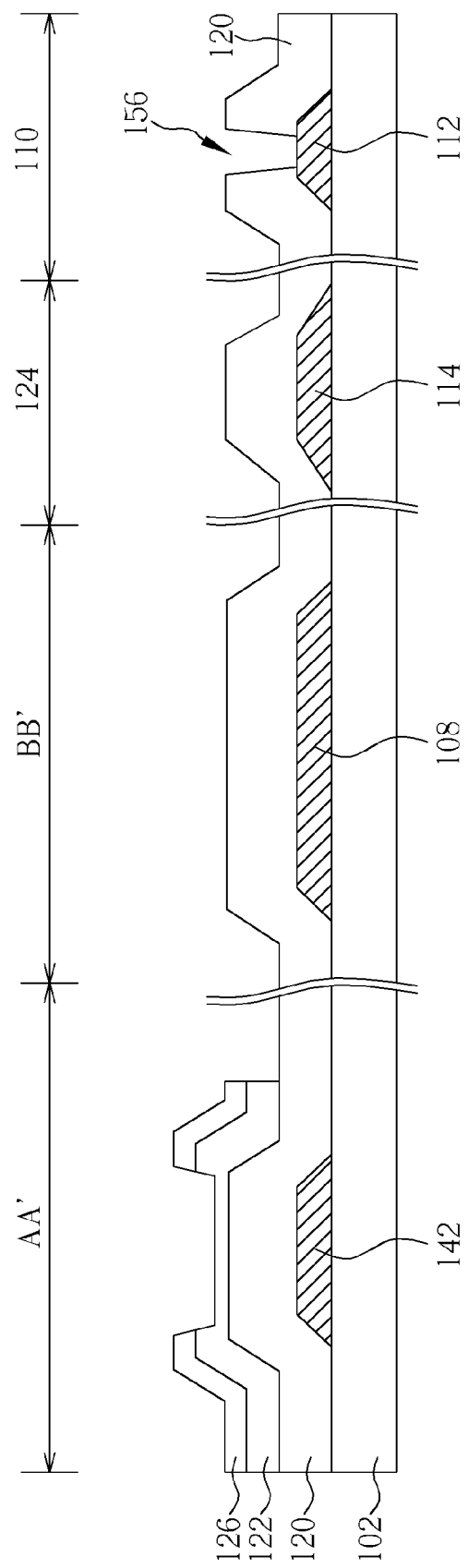
FIGS. 16 and 17 are schematic diagrams of a manufacturing method of an image TFT array for an indirect X-ray sensor in another embodiment according to the present invention.
Figure 17:
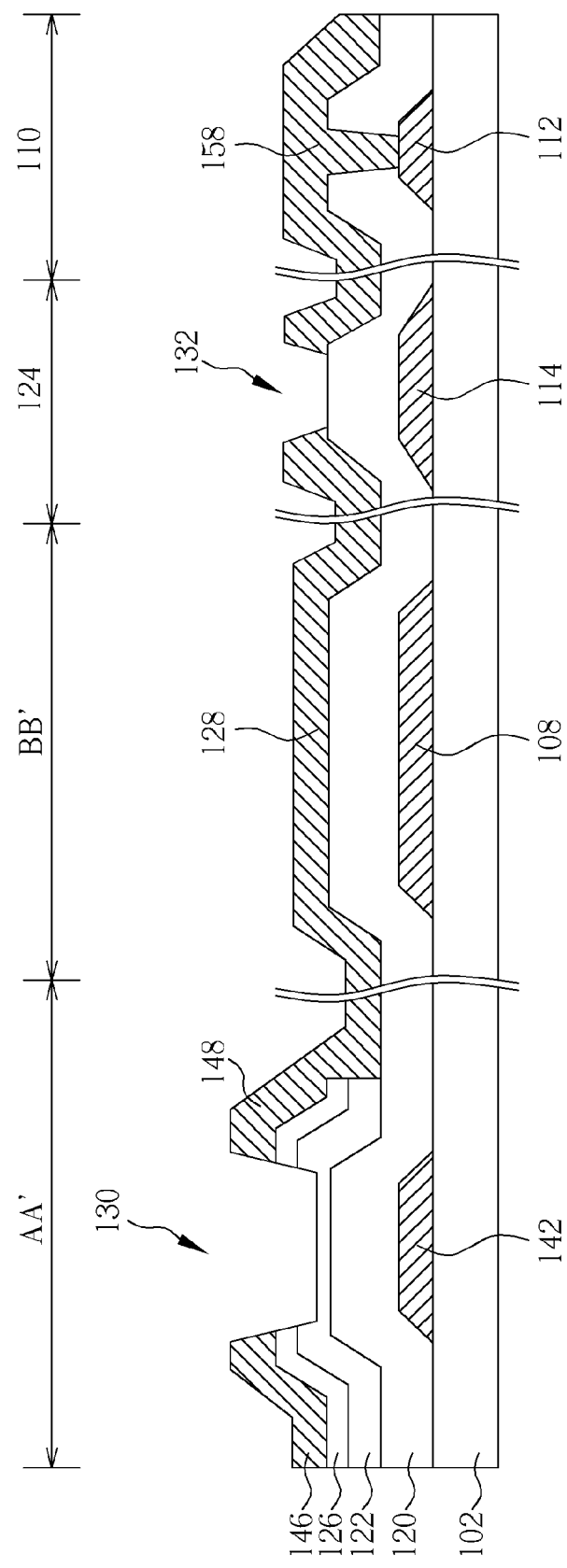

During the process for defining the island region above the gate electrode 142, as shown in FIG. 16, a through hole 156 may be defined on the common electrode 112 by etching the insulation layer 120, simultaneously. Therefore, as shown in FIG. 17, the subsequently deposited conductive layer 158 can be connected with the common electrode 112 via the through hole 156 to connect an electrostatic discharge structure.

Figure 14:
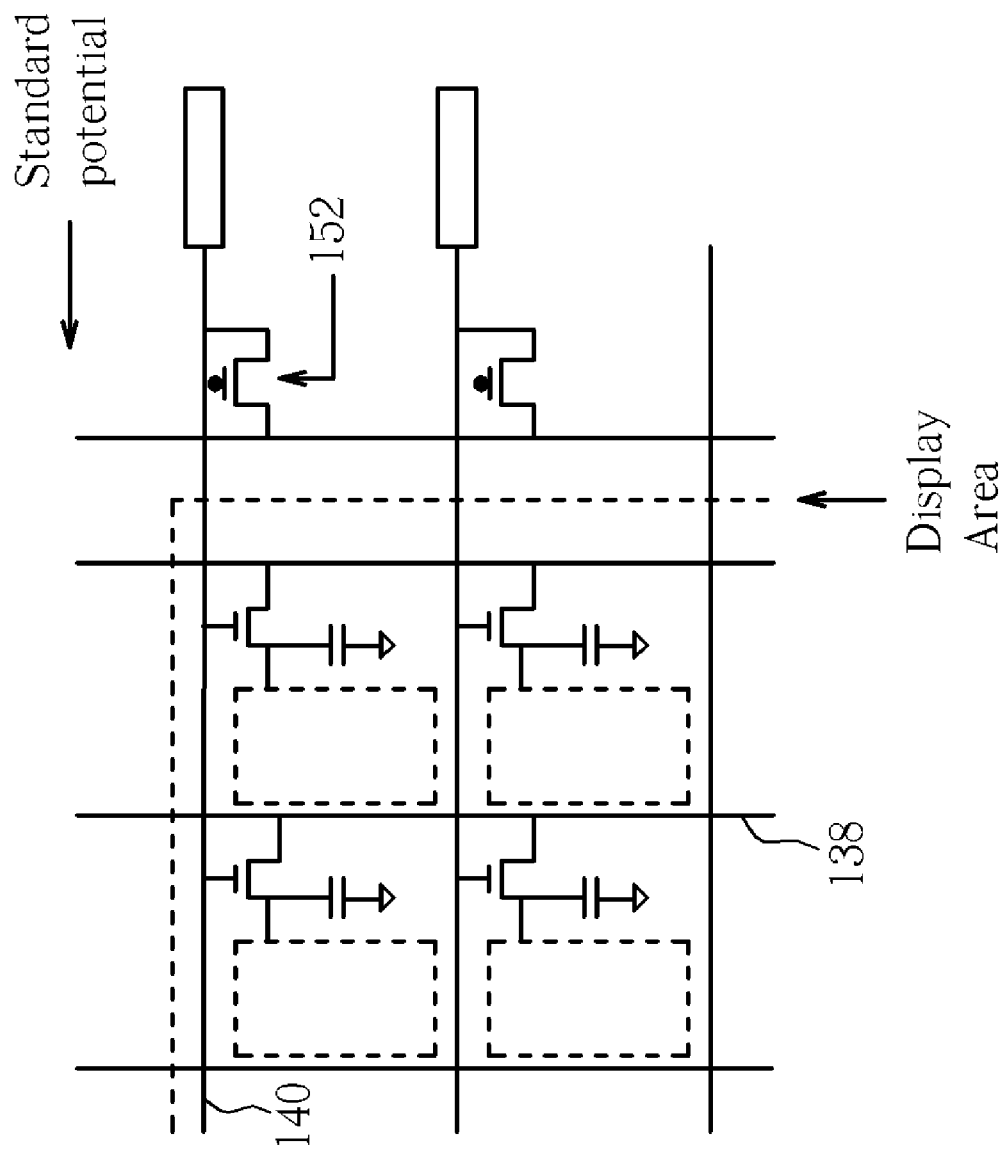
FIG. 14 is a schematic diagram of an equivalent circuit of an image TFT array for indirect X-ray sensor in another embodiment according to the present invention.
Figure 15:
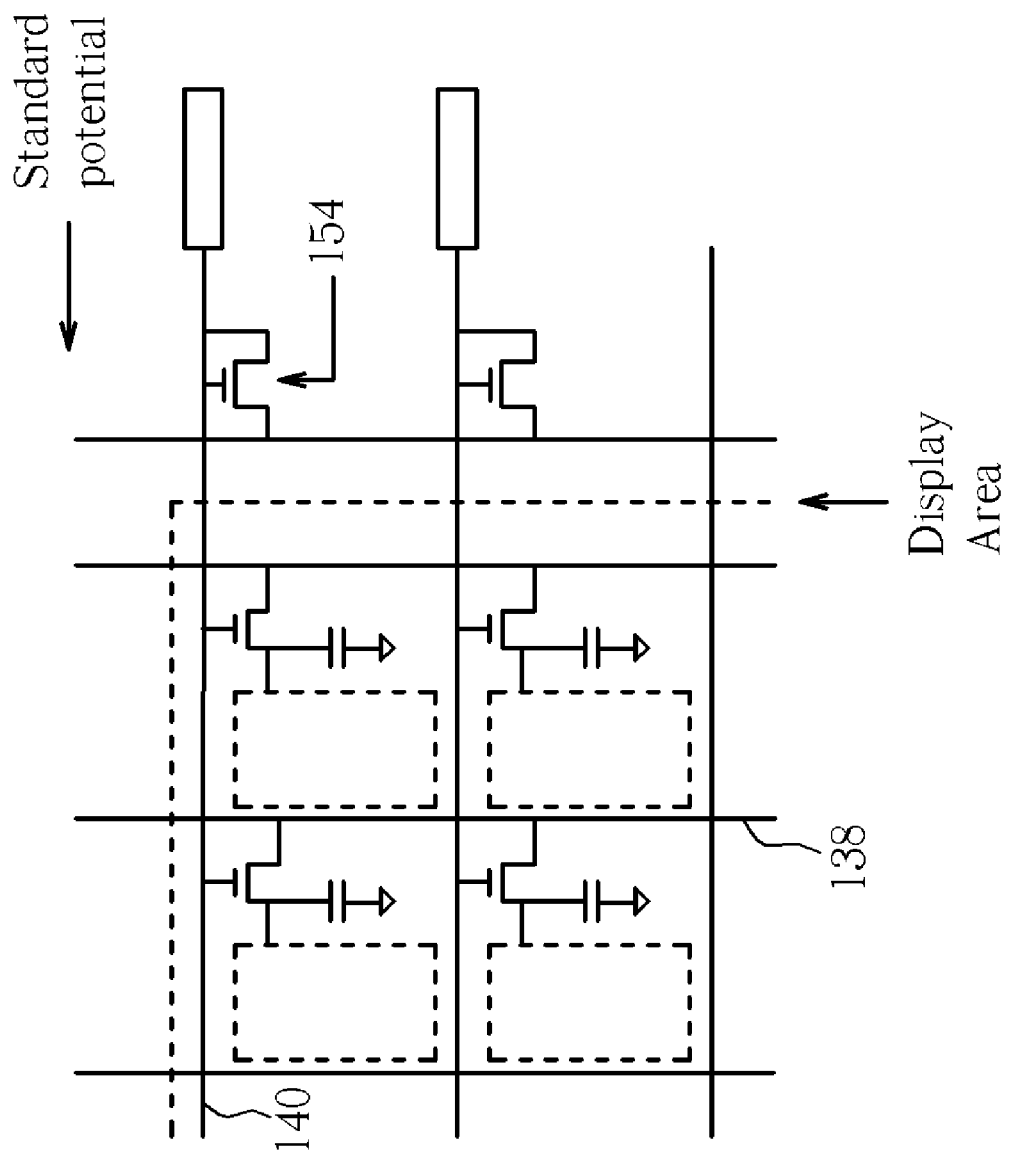
FIG. 15 is a schematic diagram of an equivalent circuit of an image TFT array for indirect X-ray sensor in still another embodiment according to the present invention.

As shown in FIGS. 14 and 15, electrostatic discharge structures 152 and 154 may be further formed on a peripheral region of the substrate of the image TFT array for an indirect X-ray sensor according to the present invention, respectively.

Compared to the prior art, the present invention integrates the manufacturing process of the gate line, the gate electrode, the lower electrode, the pad electrode, and the common electrode by utilizing only one photolithographic and etching process, and thus in turn two processes for forming through holes on the storage capacitor, common electrode, and pad electrode also can be reduced into one process. Hence, the particle issue caused by the transferring and etching steps of the high number of photolithographic and etching process in the prior art will be improved. Therefore, the present invention is capable of simplifying the manufacturing process, shortening the manufacturing time, and increasing the throughput.

Furthermore, in the X-ray image detector system of U.S. Pat. No. 6,403,965, the protecting TFT, the BCB film, and the ITO pixel electrode are necessary elements, while they are not necessary for the image TFT array for an indirect X-ray sensor according to the present invention. In addition, it is noticed that, in the indirect X-ray sensor according to the present invention, the lower electrode and the upper electrode of the storage capacitor have an approximately same large area, while the upper electrode for a direct X-ray sensor has a relative small area for not to blocking the light path.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing an image TFT array for an indirect X-ray sensor, comprising:
   providing a substrate;
   applying a first conductive layer covering the substrate;
   defining at least one first line, a lower electrode, a pad electrode, a common electrode and a first electrode connected with the first line simultaneously by etching the first conductive layer;
   forming an insulation layer covering the substrate, the first line, the lower electrode, the pad electrode, the common electrode and the first electrode;
   applying a second conductive layer covering the insulation layer;
   defining at least one second line intersecting the first line, an upper electrode corresponding to the lower electrode, a second electrode connected with the second line, a third electrode connected with the upper electrode, a first through hole corresponding to the common electrode to expose the insulation layer, and a second through hole corresponding to the pad electrode to expose the insulation layer simultaneously by etching the second conductive layer;
   applying a passivation layer covering the second conductive layer and on the insulation layer exposed by the first and the second through holes; and
   defining an aperture exposing a portion of the upper electrode and making the first and the second through holes deep to expose the common electrode and the pad electrode simultaneously by etching the passivation layer and the insulation layer.

2. The method according to claim 1, wherein the first electrode, the second electrode and the third electrode constitute a switching element.

3. The method according to claim 1, wherein the lower electrode and the upper electrode have an approximately the same size of area.

4. The method according to claim 1, wherein the first conductive layer comprises an opaque conductive material.

5. The method according to claim 1, wherein the second conductive layer comprises an opaque conductive material.

6. The method according to claim 1, further comprises a step of:
   defining an island region above the first electrode and between the insulation layer and the second conductive layer.

7. The method according to claim 6, further comprises a step of:
   applying a semiconductor layer and a doped layer covering the substrate and on the insulation layer.

8. The method according to claim 7, wherein the island region is defined by etching the semiconductor layer and the doped layer.

9. The method according to claim 7, wherein the second electrode and the third electrode are further defined by etching the semiconductor layer and the doped layer.

10. A method of manufacturing an image TFT array for an indirect X-ray sensor, comprising:
    providing a substrate;
    applying a first conductive layer covering the substrate;
    defining at least one first line, a lower electrode, a pad electrode, a common electrode and a first electrode connected with the first line simultaneously by etching the first conductive layer;
    forming an insulation layer covering the substrate, the first line, the lower electrode, the pad electrode, the common electrode and the first electrode;
    defining an island region on the insulation layer above the first electrode, and simultaneously defining a third through hole to expose the common electrode by etching the insulation layer;
    applying a second conductive layer covering the island region, the insulation layer and the third through hole;
    defining at least one second line intersecting the first line, an upper electrode corresponding to the lower electrode, a second electrode connected with the second line and a third electrode connected with the upper electrode simultaneously by etching the second conductive layer, a fourth through hole corresponding to the pad electrode to expose the insulation layer simultaneously by etching the second conductive layer;
    applying a passivation layer covering the second conductive layer and on the insulation layer exposed by the fourth through holes; and
    defining an aperture exposing a portion of the upper electrode and making the fourth through hole deep to expose the pad electrode simultaneously by etching the passivation layer and the insulation layer.

11. The method according to claim 10, wherein the second conductive layer is connected with the common electrode via the third through hole to connect a first electrostatic discharge structure.

12. The method according to claim 1, further comprises a step of:
    forming a second electrostatic discharge structure on a peripheral region of the substrate.

* * * * *